United States Patent
Shimomura et al.

(10) Patent No.: US 9,496,861 B2
(45) Date of Patent: Nov. 15, 2016

(54) MULTIPLEXER FOR VOLTAGE MEASUREMENT AND VOLTAGE MEASURING UNIT INCLUDING THE SAME

(71) Applicant: PANASONIC CORPORATION, Osaka (JP)

(72) Inventors: Kazuhiro Shimomura, Osaka (JP); Ryouta Akeyama, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 511 days.

(21) Appl. No.: 14/139,104

(22) Filed: Dec. 23, 2013

(65) Prior Publication Data

US 2014/0117975 A1 May 1, 2014

Related U.S. Application Data

(63) Continuation of application No. PCT/JP2012/001630, filed on Mar. 9, 2012.

(30) Foreign Application Priority Data

Jun. 28, 2011 (JP) .................. 2011-143209

(51) Int. Cl.

| | | |
|---|---|---|
| H01M 10/48 | (2006.01) | |
| H03K 17/00 | (2006.01) | |
| G01R 31/36 | (2006.01) | |
| G01R 19/25 | (2006.01) | |
| G01R 1/20 | (2006.01) | |

(52) U.S. Cl.
CPC ............. *H03K 17/005* (2013.01); *G01R 1/206* (2013.01); *G01R 19/2503* (2013.01); *G01R 31/362* (2013.01); *G01R 31/3658* (2013.01)

(58) Field of Classification Search
CPC ............... H03K 17/005; G01R 1/206; G01R 19/2503; G01R 31/362; G01R 31/3658
See application file for complete search history.

(56) References Cited

U.S. PATENT DOCUMENTS

2001/0048307 A1* 12/2001 Maki .................. G01R 31/3658
324/387
2006/0012336 A1 1/2006 Fujita

FOREIGN PATENT DOCUMENTS

| JP | 2009-189172 A | 8/2009 |
| JP | 2010-060435 A | 3/2010 |

OTHER PUBLICATIONS

International Search Report issued in PCT/JP2012/001630, dated Jun. 12, 2012.

* cited by examiner

*Primary Examiner* — David Gray
*Assistant Examiner* — Michael Harrison
(74) *Attorney, Agent, or Firm* — McDermott Will & Emery LLP

(57) ABSTRACT

A multiplexer for voltage measurement includes: a first switch disposed on a first channel extending between at least one high-voltage input terminal and an output terminal; a plurality of second switches respectively disposed on second channels each extending between each of input terminals other than the high-voltage input terminal and the output terminal; and a third switch disposed between a group of the plurality of second switches and an output terminal side end of the first switch. Each of the first switch and the third switch is configured to operate even by a voltage higher than a power supply voltage.

8 Claims, 13 Drawing Sheets

MULTIPLEXER FOR VOLTAGE MEASUREMENT AND VOLTAGE MEASURING UNIT INCLUDING THE SAME

This is a continuation application under 35 U.S.C 111(a) of pending prior International application No.PCT/JP2012/001630, filed on Mar. 9, 2012, which in turn claims the benefit of Japanese Application No. 2011-143209, filed on Jun. 28, 2011, the disclosures of which Applications are incorporated by reference herein.

BACKGROUND OF THE INVENTION

1. Field of the Invention

The present invention relates to a multiplexer for voltage measurement used to measure voltages of a predetermined number of battery cells connected in series and constituting a battery cell array and a voltage measuring unit including the multiplexer.

2. Description of the Related Art

As batteries installed in hybrid electric vehicles (HEV) and electric vehicles (EV), highly-efficient lithium ion batteries that are higher in output voltage and energy density than typical secondary batteries are used in many cases. However, it is difficult to control charging and discharging of the lithium ion batteries, and the lithium ion batteries are at risk for explosion or fire. Therefore, in the case of using the lithium ion batteries as in-vehicle batteries, the voltage management of the batteries is especially important.

Known as a voltage measuring unit configured to measure the voltages of such batteries is a unit configured to sequentially measure the voltage between both ends of each of the battery cells connected in series (see Japanese Laid-Open Patent Application Publication No. 2010-60435, for example).

FIG. 11 is a circuit diagram showing a schematic configuration of a conventional voltage measuring unit. As shown in FIG. 11, to measure the voltages of a plurality of (n) battery cells Cj (j equals 1 to n) connected in series and constituting a battery cell array 101, a conventional voltage measuring unit 110 includes: a multiplexer 102 configured to receive voltages at respective connection terminals of a plurality of battery cells Cj and output one of those voltages; and a signal processor 103 configured to perform calculation processing of the voltages of the battery cells Cj based on the output from the multiplexer 102. The multiplexer 102 includes pairs of switches SWAi and SWBi, each pair being provided for each of a plurality of input terminals Ti (i equals 0 to n) to each of which the voltage of each end of each battery cell Cj is input. By turning on the switch SWAi, the voltage at one end of the corresponding battery cell Cj is connected to one (normal phase output terminal TO1) of a pair of output terminals TO1 and TO2. By turning on the switch SWBi, the voltage at one end of the corresponding battery cell Cj is connected to the other (reverse phase output terminal TO2) of the pair of output terminals TO1 and TO2. According to this configuration, the voltage of the battery cell Cj is measured in such a manner that a node of the connection terminal of the battery cell Cj is selectively connected to the signal processor 103 through the switch SWAi or SWBi corresponding to the node. Voltage data of the battery cells Cj are collected by sequentially performing the above operation with respect to all the battery cells Cj, and the batteries are controlled based on the data.

SUMMARY OF THE INVENTION

In the voltage measuring unit, the voltage of the battery cell array 101 (total voltage value VCn of the n battery cells Cj connected in series) is also utilized as a drive power supply (power supply voltage VBAT) for respective components, such as the multiplexer 102. At this time, the power supply voltage VBAT may swing by driving of respective components, noises, and the like. In a case where an external power supply is connected to the voltage measuring unit, the power supply voltage VBAT also swings by a current ripple of the external power supply, and the like. To prevent voltage measurement accuracy of the battery cell array 101 from deteriorating by the swing of the power supply voltage VBAT, it is known that a filter 104 constituted by a capacitor CB and a resistor RB is inserted between a channel for drive power supply and a channel for voltage measurement.

However, there is a problem that if the voltage VCn of the battery cell array 101 becomes higher than the power supply voltage VBAT by the swing of the power supply voltage VBAT, the switches SWAp and SWBp (for example, p equals n-1, n, etc.) corresponding to the voltages of the battery cells (some of high potential-side battery cells) to each of which the voltage higher than the power supply voltage VBAT is applied malfunction, and this deteriorates the voltage measurement accuracy of the battery cell Cj.

FIG. 12 is a circuit diagram showing a schematic configuration of a switch used in the voltage measuring unit shown in FIG. 11. As shown in FIG. 12, each of the switches SWAi and SWBi is constituted by a so-called CMOS switch (transmission gate) configured such that: an N-channel MOS transistor 121 and a P-channel MOS transistor 122 are connected in parallel; and the connection between a source and a drain is established or cut by respectively inputting control signals C and NC to gates, the control signals C and NC being inverted from each other. Each of the switches SWAi and SWBi is turned on or off based on the power supply voltage VBAT and a ground voltage GND. Therefore, if a voltage higher than the power supply voltage VBAT is input to the switch SWAi or SWBi, the switch SWAi or SWBi may be turned on regardless of the states of the control signals. As a result, the high potential-side battery cell is connected to the voltage measuring unit even when the voltage measuring unit is measuring the voltage of the other battery cell Cj, so that the voltage measuring unit cannot correctly measure the voltage of the battery cell.

Here, there is also a MOS switch that does not malfunction even in a case where a voltage higher than the power supply voltage is input thereto. FIG. 13 is a circuit diagram showing a schematic configuration of a conventional boost MOS switch. Such a boost MOS switch is configured to change the control voltage in accordance with input and output voltages of the multiplexer 102. Specifically, the boost MOS switch includes: two P-channel MOS transistors 131 and 132 whose drains are connected to each other; and switching portions 135 and 136 each configured to directly connect a gate and source of the P-channel MOS transistor 131 or 132 or to connect the gate and source of the P-channel MOS transistor 131 or 132 via a voltage source 133 or 134 configured to generate a predetermined offset voltage Vc. In a case where the switching portions 135 and 136 are switched to directly connect the gate and source of each of the MOS transistors 131 and 132, the MOS switch is turned off. In a case where the switching portions 135 and 136 are switched to connect the gate and source of each of the MOS transistors 131 and 132 via the voltage source 133 or 134, a gate voltage of each of the P-channel MOS transistors 131 and 132 is made lower than a source voltage thereof by the offset voltage Vc. With this, the P-channel MOS transistors 131 and 132 are turned on, so that the MOS switch is turned on. In the case of using such a switch, even if a voltage higher than the power supply voltage VBAT is input, the MOS transistors 131 and 132 are not turned on as long as each of the switching portions 135 and 136 directly connects the gate and source of the MOS transistor 131 or 132. Therefore, the voltage measuring unit can correctly measure the voltage of the battery cell.

However, in the case of adopting such a boost MOS switch, each of all the switches SWAi and SWBi connected to all the battery cells Cj needs to be replaced with the boost PMOS switch shown in FIG. 13. This is because there is a possibility that in a case where the switches SWAp and SWBp corresponding to the high potential-side battery cell are turned on, a voltage higher than the power supply voltage VBAT is applied to the output terminals of the switches SWAi and SWBi corresponding to the other battery cell. The boost MOS switch shown in FIG. 13 is larger in circuit area than a normal transmission gate. Therefore, in a case where the boost MOS switch is adopted as each of all the switches SWAi and SWBi, the circuit area of the multiplexer 102 increases, so that the voltage measuring unit increases in size.

The present invention was made to solve the above conventional problems, and an object of the present invention is to provide a multiplexer for voltage measurement capable of suppressing an increase in circuit area while realizing highly accurate voltage measurement even in a case where an input voltage higher than a power supply voltage is input thereto, and a voltage measuring unit including the multiplexer.

A multiplexer for voltage measurement according to one aspect of the present invention is a multiplexer for voltage measurement configured to receive voltages at connection terminals of a plurality of battery cells connected in series and constituting a battery cell array and output one of the voltages, to measure voltages of the battery cells, the multiplexer including: a plurality of input terminals to which the voltages at the connection terminals of the plurality of battery cells are respectively input; an output terminal through which any one of the voltages input from the plurality of input terminals is output; a first switch disposed on a first channel extending between at least one high-voltage input terminal that is one of the plurality of input terminals and the output terminal and configured to establish or cut a connection between the high-voltage input terminal and the output terminal, the high-voltage input terminal being connected to a predetermined number of battery cells, the predetermined number being counted from a side where a highest voltage among the voltages respectively applied to the plurality of input terminals is applied; a plurality of second switches respectively disposed on second channels each extending between each of the input terminals other than the high-voltage input terminal and the output terminal so as to respectively correspond to the input terminals, and configured to selectively establish or cut a connection between any one of the input terminals other than the high-voltage input terminal and the output terminal; and a third switch disposed between a group of the plurality of second switches and an output terminal side end of the first switch, wherein each of the first switch and the third switch is configured to operate even by a voltage higher than a power supply voltage that is based on a voltage of the battery cell array, the voltage of the battery cell array being used to drive each of the first, second, and third switches.

According to the above configuration, among the channels each extending between the output terminal and each of the input terminals to which the voltages at the connection terminals of the battery cells are respectively input, the channel (first channel) including the input terminal to which the input voltage higher than the power supply voltage may be applied and the channels (second channels) respectively including the input terminals to each of which the input voltage lower than the power supply voltage is applied are separately provided. In addition, each of the first switch disposed on the first channel and connected to the output terminal and the third switch disposed on the second channel and connected to the output terminal is configured to operate even by the voltage higher than the power supply voltage for driving each of the switches of the multiplexer. With this, each of the second switches respectively disposed on the second channels so as to respectively correspond to the input terminals to each of which a high voltage is not applied is constituted by a conventional simple switch, and the third switch is disposed on the channel formed by integrating the channels each extending between the output terminal and each of the second switches. With this, it is possible to reduce the number of third switches configured to operate even by the voltage higher than the power supply voltage. Therefore, even in a case where the input voltage higher than the power supply voltage is applied, the increase in the circuit area can be suppressed while realizing highly accurate voltage measurement.

The multiplexer may be configured such that the high-voltage input terminal is the input terminal to which a highest voltage among the voltages respectively applied to the plurality of input terminals is applied.

The multiplexer may be configured such that: the output terminal is constituted by a pair of output terminals; and each of the first switch, the second switches, and the third switch includes a normal phase switch configured to establish or cut a connection between any one of the plurality of input terminals and one of the pair of output terminals, and a reverse phase switch configured to establish or cut a connection between any one of the plurality of input terminals and the other of the pair of output terminals.

The multiplexer may be configured such that the first switch includes: a first MOS transistor in which a first main terminal thereof is connected to the input terminal, and a second main terminal thereof is connected to the output terminal; a first constant voltage element connected between a control terminal of the first MOS transistor and the first main terminal thereof and configured to define a maximum value of a potential difference between the control terminal and the first main terminal; a first capacitor including one end connected to the control terminal; a fourth switch configured to establish or cut a connection between the first capacitor and a reference potential; and a first constant voltage circuit configured to apply a predetermined voltage to between the first capacitor and the fourth switch. According to this, the first MOS transistor is turned on by applying a constant voltage, generated by the first constant voltage circuit, to the first capacitor connected to the control terminal of the first MOS transistor. To be specific, the voltage (control voltage) applied to the control terminal of the first MOS transistor does not depend on the power supply voltage. In addition, the first constant voltage element is connected between one of the main terminals of the first MOS transistor and the control terminal of the first MOS transistor, and the voltage therebetween is controlled to be equal to or lower than the constant voltage by the first constant voltage element. Therefore, the first switch can operate even by the voltage higher than the power supply voltage with a simple configuration.

The multiplexer may be configured such that the first constant voltage circuit includes: a second constant voltage element connected to the other end of the first capacitor; and a current source configured to supply a current to the second constant voltage element to apply a predetermined constant voltage to between the first capacitor and the second constant voltage element. According to this, the constant voltage can be easily generated by supplying a current from the current source to the second constant voltage element.

The multiplexer may be configured such that the third switch includes: a second MOS transistor in which a first main terminal thereof is connected to the second switches, and a second main terminal thereof is connected to the output terminal, the second MOS transistor being complementary to the first MOS transistor; a third constant voltage element connected between a control terminal of the second MOS transistor and of the first main terminal thereof and configured to define a maximum value of a potential difference between the control terminal and the first main terminal; a second capacitor including one end connected to the control terminal; a fifth switch configured to establish or cut a connection between the second capacitor and a reference potential; and a second constant voltage circuit configured to apply a predetermined voltage to between the second capacitor and the fifth switch. According to this, as with the first switch, the third switch can operate even by the voltage higher than the power supply voltage with a simple configuration. Further, since the second MOS transistor is complementarily connected to the first MOS transistor of the first switch, the first capacitor of the first switch, the fourth switch, and the first constant voltage circuit can also serve as the second capacitor, the fifth switch, and the second constant voltage circuit, respectively.

The multiplexer may include: a pair of sixth switches, one of which is connected between the first switch and one of the pair of output terminals, and the other of which is connected between the third switch and the other of the pair of output terminals; and a flying capacitor connected between the first switch and one of the pair of sixth switches and between the third switch and the other of the pair of sixth switches. According to this, by establishing the connection by the first switch or the third switch in a state where the connections by the sixth switches are being cut, the flying capacitor is charged by the voltage to be measured. After that, by establishing the connections by the sixth switches in a state where the connection by the first switch or the third switch is being cut, the voltage charged in the flying capacitor is applied to the output terminal (the voltage charged in the flying capacitor is input to the signal processor connected to and located behind the output terminal). With this, the highly accurate voltage measurement can be performed while securing the insulation property between the battery cell and the signal processor. In addition, the voltage to be charged in the flying capacitor is the difference voltage between the voltage connected to the normal phase and the voltage connected to the reverse phase. Therefore, each of the flying capacitor and the sixth switch can be configured as a typical component driven by a voltage equal to or lower than the power supply voltage (each of the flying capacitor and the sixth switch does not have to be configured as a component capable of being driven by a high voltage).

A voltage measuring unit according to another aspect of the present invention includes: the multiplexer configured as above; and a signal processor configured to perform calculation processing of voltages of the battery cells based on the voltages at the input terminals output from the pair of output terminals.

According to the above configuration, since the voltage measuring unit is configured to include the multiplexer capable of suppressing the increase in the circuit area while realizing the highly accurate voltage measurement even in a case where the input voltage higher than the power supply voltage is applied, the voltage measuring unit can measure the voltage of the battery cell with a high degree of accuracy while reducing the size of the voltage measuring unit.

The above object, other objects, features and advantages of the present invention will be made clear by the following detailed explanation of preferred embodiments with reference to the attached drawings.

The present invention is configured as explained above and has an effect of suppressing the increase in the circuit area while realizing the highly accurate voltage measurement even in a case where the input voltage higher than the power supply voltage is applied.

DESCRIPTION OF THE PREFERRED EMBODIMENTS

Hereinafter, embodiments of the present invention will be explained in reference to the drawings. In the following explanations and drawings, the same reference signs are used for the same or corresponding components, and a repetition of the same explanation is avoided.

Embodiment 1

Figure 1:
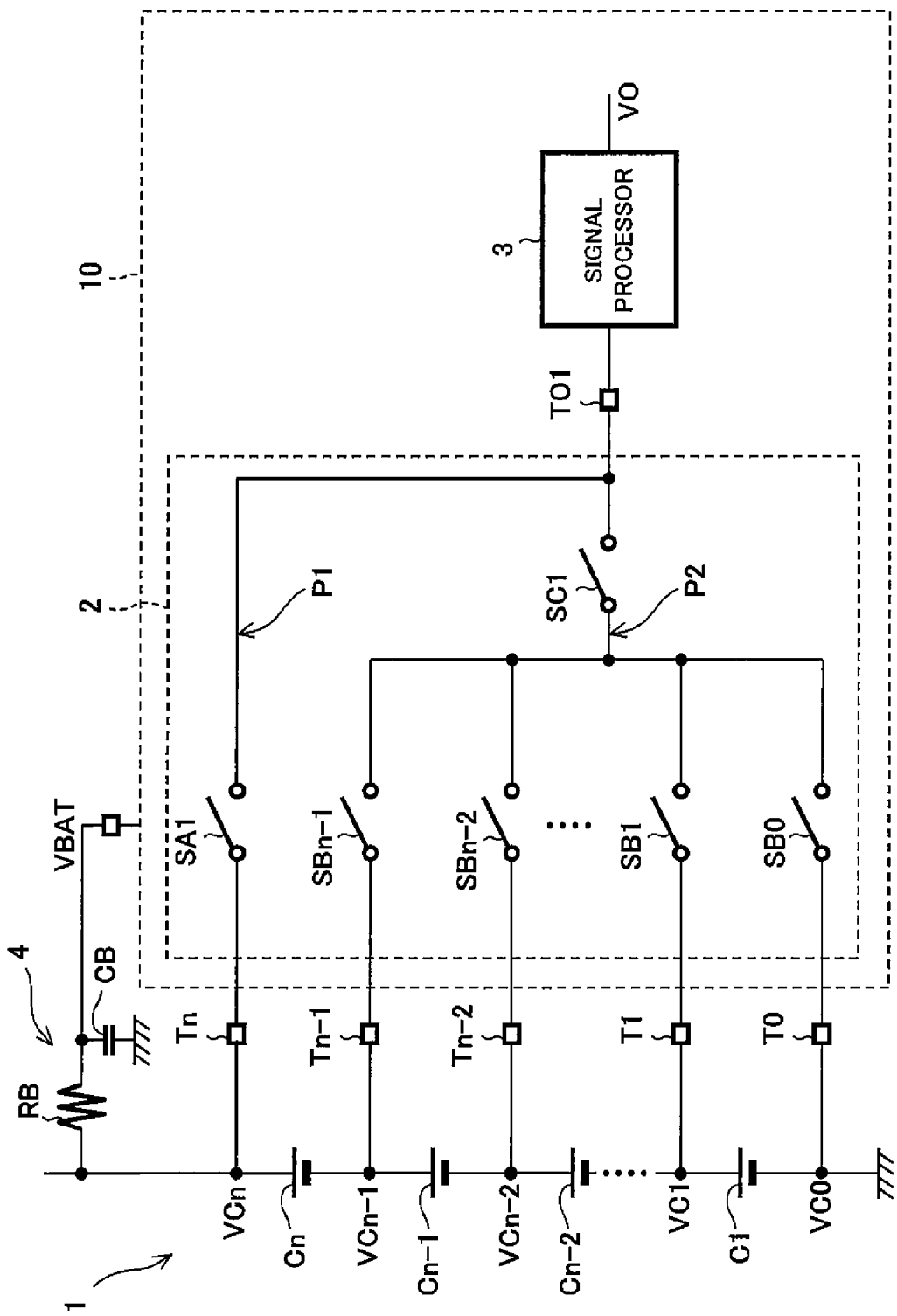
FIG. 1 is a circuit diagram showing an example of a schematic configuration of a voltage measuring unit to which a multiplexer according to Embodiment 1 of the present invention is applied.

First, a voltage measuring unit to which a multiplexer according to Embodiment 1 of the present invention is applied will be explained. FIG. 1 is a circuit diagram showing an example of a schematic configuration of the voltage measuring unit to which the multiplexer according to Embodiment 1 of the present invention is applied.

As shown in FIG. 1, to measure the voltages of a plurality of (n) battery cells Cj (j equals 1 to n) connected in series and constituting a battery cell array 1, a voltage measuring unit 10 of the present embodiment includes: a multiplexer 2 configured to receive voltages at respective connection terminals of the plurality of battery cells Cj and output one of those voltages; and a signal processor 3 configured to perform calculation processing of the voltages of the battery cells Cj based on the output from the multiplexer 2. The multiplexer 2 includes: a plurality of input terminals Ti to which voltages VCi (i equals 0 and 1 to n) at the connection terminals of the battery cells Cj are respectively input; and an output terminal TO1 through which any one of the voltages input through the plurality of input terminals Ti is output. The signal processor 3 is connected to the output terminal TO1.

A first switch SA1 is disposed on a first channel P1 extending between at least one high-voltage input terminal Tn that is one of the plurality of input terminals Ti and the output terminal TO1, the high-voltage input terminal Tn being connected to connection terminals of a predetermined number of battery cells (in the present embodiment, the connection terminal of one battery cell Cn), the predetermined number being counted from a side where a highest voltage among the voltages respectively applied to the plurality of input terminals Ti is applied. The first switch SA1 is configured to establish or cut the connection between the high-voltage input terminal Tn and the output terminal TO1. In addition, second switches SB0 to SBn-1 are disposed on second channels P2 each extending between each of the input terminals T0 to Tn-1 other than the high-voltage input terminal Tn and the output terminal TO1 so as to respectively correspond to the input terminals T0 to Tn-1. The plurality of second switches SB0 to SBn-1 are configured to selectively establish or cut the connection between any one of the input terminals T0 to Tn-1 other than the high-voltage input terminal Tn and the output terminal TO1.

Further, a third switch SC1 is disposed between a group of the plurality of second switches SB0 to SBn-1 and an output terminal TO1 side end of the first switch SA1. In the present embodiment, to connect the plurality of second switches SB0 to SBn-1 and the third switch SC1, the second channels are integrated as one channel extending between the group of the second switches SB0 to SBn-1 and the third switch SC1.

The switches are turned on or off by a controller (not shown), such as a microcontroller, provided externally or internally. The first switch SA1 and the third switch SC1 are alternatively turned on. To be specific, in the case of measuring the voltage VCn input to the high-voltage input terminal Tn, the first switch SA1 is turned on in a state where the third switch SC1 is turned off. In the case of measuring the voltages VC0 to VCn-1 respectively input to the input terminals T0 to Tn-1 other than the high-voltage input terminal Tn, the third switch SC1 is turned on in a state where the first switch SA1 is turned off.

In the voltage measuring unit 10, the voltage of the battery cell array 1 (total voltage value VCn of the n battery cells Cj connected in series) is also utilized as a drive power supply (power supply voltage VBAT) for respective components, such as the multiplexer 2 and the signal processor 3. To prevent the voltage measurement accuracy of the battery cell array 1 from deteriorating by the swing of the power supply voltage VBAT, a filter 4 constituted by a capacitor CB and a resistor RB is inserted between a channel for drive power supply and a channel for voltage measurement.

Figure 2:
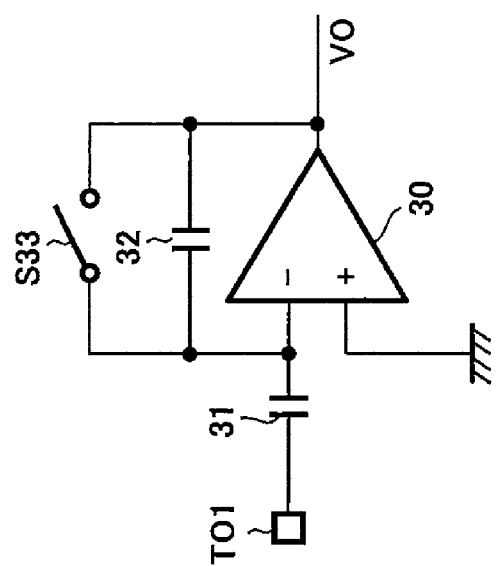
FIG. 2 is a circuit diagram showing a schematic configuration of a signal processor of the voltage measuring unit shown in FIG. 1.

FIG. 2 is a circuit diagram showing a schematic configuration of the signal processor of the voltage measuring unit shown in FIG. 1. As shown in FIG. 2, the signal processor 3 includes: a capacitor 31 including one end connected to the output terminal TO1 of the multiplexer 2 and charged in accordance with the voltage output from the output terminal TO1; a differential amplifier 30 including an input terminal connected to the other end of the capacitor 31; a capacitor 32 connected between the input and output terminals of the differential amplifier 30; and a switch S33 connected in parallel with the capacitor 32. The differential amplifier 30 includes a non-inverted input terminal connected to a reference voltage and an inverted input terminal connected to the capacitor 31.

Operations of the signal processor 3 configured as above will be explained using as an example a case where the voltage of the battery cell Cn is measured. First, the switch S33 is turned on (connected) in a state where the switches of the multiplexer 2 are turned off. With this, the electric charge of the capacitors 31 and 32 is discharged, and the output voltage VO of the differential amplifier 30 is set to zero. After that, the first switch SA1 is turned on. With this, the voltage VCn at an upper side of the battery cell Cn is output to the output terminal TO1 through the first channel P1 including the input terminal Tn and the switch SA1. The capacitor 31 is charged in accordance with the voltage VCn output from the output terminal TO1. After that, the switch S33 and the first switch SA1 are turned off, and the second switch SBn-1 is then turned on. With this, the voltage VCn-1 at a lower side of the battery cell Cn is output to the output terminal TO1 through the second channel P2 including the input terminal Tn-1 and the switch SBn-1. Thus, the electric charge corresponding to the voltage drop from the voltage VCn to the voltage VCn-1 is discharged from the capacitor 31 such that the electric charge corresponding to the voltage VCn-1 is accumulated in the capacitor 31. At this time, since the switch S33 is in an off state, the electric charge corresponding to the voltage drop is transferred from the capacitor 31 to the capacitor 32. Thus, the difference voltage between the voltage VCn and the voltage VCn-1, that is, the voltage of the battery cell Cn is applied to the capacitor 32, and this is output as the output voltage VO of the differential amplifier 30. The same is true for a case where the voltages of the other battery cells Cj are measured.

Here, each of the first switch SA1 and the third switch SC1 is configured to operate even by a voltage higher than the power supply voltage VBAT that is based on the voltage VCn (total voltage value of the n battery cells Cj connected in series) of the battery cell array 1, the voltage VCn of the battery cell array 1 being used to drive each of the first, second, and third switches.

Figure 12:
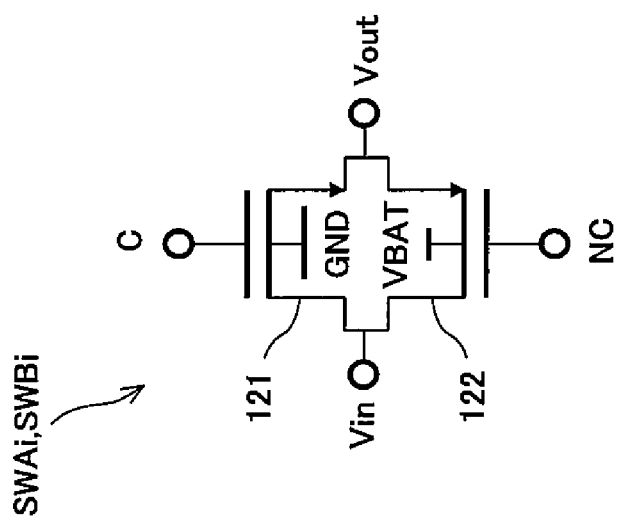
FIG. 12 is a circuit diagram showing a schematic configuration of a switch used in the voltage measuring unit shown in FIG. 11.

According to the above configuration, among the channels each extending between the output terminal TO1 and each of the input terminals Ti to which the voltages VCi at the connection terminals of the plurality of battery cells Cj are respectively input, the channel (first channel P1) including the input terminal Tn to which the input voltage higher than the power supply voltage VBAT may be applied and the channels (second channels P2) respectively including the input terminals T0 to Tn-1 to each of which the input voltage lower than the power supply voltage VBAT is applied are separately provided. In addition, each of the first switch SA1 disposed on the first channel P1 and connected to the output terminal TO1 and the third switch SC1 disposed on the second channel P2 and connected to the output terminal TO1 is configured to operate even by the voltage higher than the power supply voltage VBAT for driving each of the switches of the multiplexer 2. With this, each of the second switches SB0 to SBn-1 respectively disposed on the second channels P2 so as to respectively correspond to the input terminals T0 to Tn-1 to each of which a high voltage is not applied is constituted by a conventional simple switch (such as the switch shown in FIG. 12), and the third switch SC1 is disposed on the channel formed by integrating the channels each extending between the output terminal TO1 and each of the second switches SB0 to SBn-1. With this, it is possible to reduce the number of third switches SC1 configured to operate even by the voltage higher than the power supply voltage VBAT (in the present embodiment, only one third switch SC1 is disposed). Therefore, even in a case where the input voltage higher than the power supply voltage VBAT is applied, the increase in the circuit area can be suppressed while realizing highly accurate voltage measurement.

Figure 13:
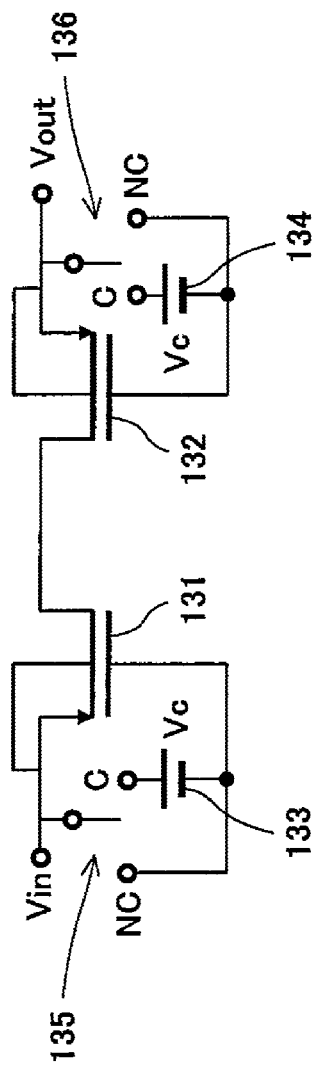
FIG. 13 is a circuit diagram showing a schematic configuration of a conventional boost MOS switch.

Each of the first switch SA1 and the third switch SC1 each configured to operate even by the voltage higher than the power supply voltage VBAT may be a boost switching circuit in which, as shown in FIG. 13, the voltage difference is generated between the gate and source of each of the MOS transistors 131 and 132 using the offset voltage Vc. However, the present embodiment is not limited to this.

Figure 3:
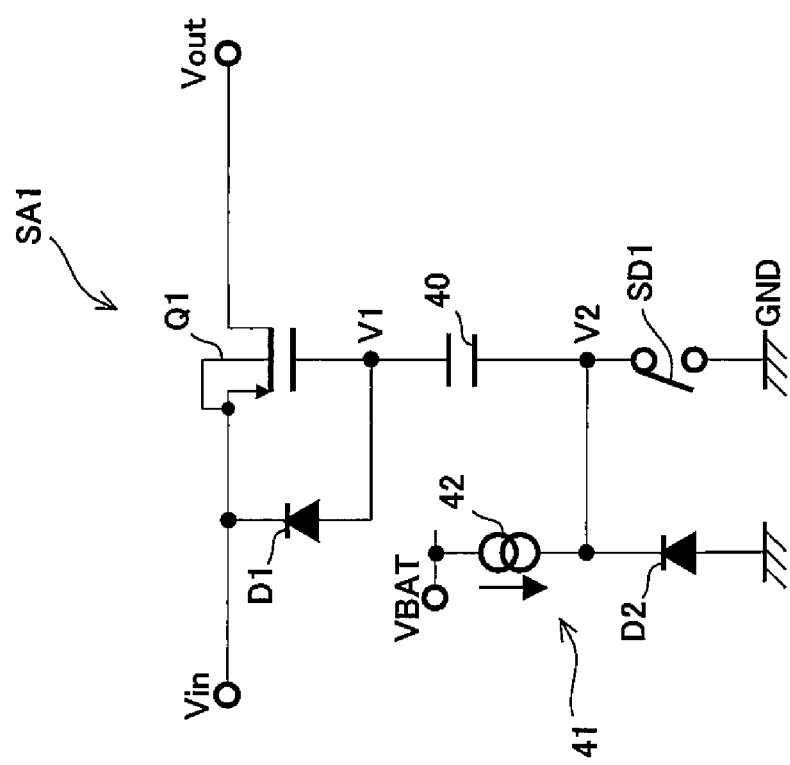
FIG. 3 is a circuit diagram showing a schematic configuration of a first switch of the multiplexer shown in FIG. 1.

In the present embodiment, the first switch SA1 and the third switch SC1 configured as below are used. FIG. 3 is a circuit diagram showing a schematic configuration of the first switch of the multiplexer shown in FIG. 1. As shown in FIG. 3, the first switch SA1 includes: a first MOS transistor Q1 in which a first main terminal (source) thereof is connected to the input terminal Tn (an input voltage Vin is input to the first main terminal), and a second main terminal (drain) thereof is connected to the output terminal TO1 (an output voltage Vout is applied to the second main terminal); a first constant voltage element D1 connected between a control terminal (gate) of the first MOS transistor Q1 and the first main terminal thereof and configured to define a maximum value of the potential difference between the control terminal and the first main terminal (maximum value of the voltage between the gate and the source); a first capacitor 40 including one end connected to the control terminal; a fourth switch SD1 configured to establish or cut the connection between the first capacitor 40 and a ground GND that has a reference potential; and a first constant voltage circuit 41 configured to apply a predetermined voltage to between the first capacitor 40 and the fourth switch SD1. In the present embodiment, the first MOS transistor Q1 is constituted by a P-channel MOS transistor.

The first constant voltage circuit 41 includes: a second constant voltage element D2 connected to the other end of the first capacitor 40; and a first current source 42 configured to supply a current to the second constant voltage element D2 to apply a predetermined constant voltage VD to between the first capacitor 40 and the second constant voltage element D2.

For example, a zener diode is used as each of the first constant voltage element D1 and the second constant voltage element D2. Each of the first constant voltage element D1 and the second constant voltage element D2 has a forward direction voltage VD, and the forward direction voltage VD is set as an adequate voltage by which the first MOS transistor Q1 is turned on. In the present embodiment, the first MOS transistor Q1 is constituted by a P-channel MOS transistor. Therefore, a forward direction of the first constant voltage element D1 is set to a direction from the gate of the first MOS transistor Q1 to the source thereof.

According to the above configuration, the first MOS transistor Q1 is turned on by applying a constant voltage VD, generated by the first constant voltage circuit 41, to the first capacitor 40 connected to the control terminal of the first MOS transistor Q1. To be specific, the voltage (control voltage) VD applied to the control terminal of the first MOS transistor Q1 does not depend on the power supply voltage VBAT. In addition, the first constant voltage element D1 is connected between one of the main terminals of the first MOS transistor Q1 and the control terminal of the first MOS transistor Q1, and the voltage therebetween is controlled to be equal to or lower than the constant voltage VD by the first constant voltage element D1. Therefore, the first switch SA1 can operate even by the voltage higher than the power supply voltage VBAT with a simple configuration. In addition, the constant voltage VD can be easily generated by supplying the current from the first current source 42 to the second constant voltage element D2.

Figure 4:
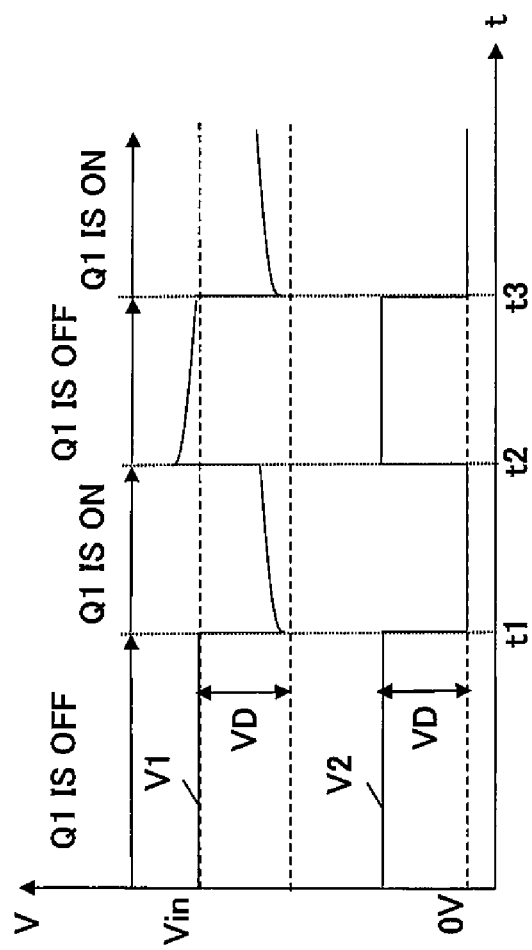
FIG. 4 is a graph showing a voltage waveform between both end portions of a first capacitor in a first switch shown in FIG. 3.

Operations of the first switch SA1 will be more specifically explained. FIG. 4 is a graph showing a voltage waveform between both end portions of the first capacitor in the first switch shown in FIG. 3. FIG. 4 shows a change with time in a voltage (first end portion voltage) V1 between the first capacitor 40 and the control terminal of the first MOS transistor Q1 and a change with time in a voltage (second end portion voltage) V2 between the first capacitor 40 the fourth switch SD1.

First, when the fourth switch SD1 is in an off state, the constant voltage VD is generated at the second constant voltage element D2 by the supply of a current from the first current source 42 to the second constant voltage element D2. With this, the voltage (second end portion voltage) V2 between the first capacitor 40 and the fourth switch SD1 becomes the constant voltage VD of the second constant voltage element D2. Here, if an adequate time has elapsed, and the first capacitor 40 is in a steady state, a current does not flow through the first capacitor 40, so that the current does not flow through the first constant voltage element D1, either. Therefore, the voltage (first end portion voltage) V1 between the first capacitor 40 and the control terminal of the first MOS transistor Q1 becomes equal to the input voltage Vin. On this account, the potential difference is not generated between the source and gate of the first MOS transistor Q1, and the first MOS transistor Q1 is turned off (time points 0 to t1).

Next, when the fourth switch SD1 is turned on at a time point t1, a fourth switch SD1 side end of the first capacitor 40 is connected to the ground GND. Therefore, the second end portion voltage V2 changes from the voltage VD to the reference potential (0 V). On the other hand, since the potential difference between both ends of the first capacitor 40 instantly changes little, the first end portion voltage V1 also decreases by the voltage drop (voltage VD) of the second end portion voltage V2, that is, V1 equals Vin−VD. With this, the potential difference VD is generated between the source and gate of the first MOS transistor Q1, and the first MOS transistor Q1 is turned on. After that, when the fourth switch SD1 is turned off at a time point t2, the second end portion voltage V2 changes from the reference potential to the constant voltage VD generated by the second constant voltage element D2, so that the first end portion voltage V1 also increases by the voltage increase (voltage VD) of the second end portion voltage V2. Here, the first end portion voltage V1 slightly increases in an on period of the fourth switch SD1. Therefore, the first end portion voltage V1 immediately before the fourth switch SD1 is turned off is not lower than Vin−VD. On this account, by turning off the fourth switch SD1, the first end portion voltage V1 increases by the voltage VD to become a voltage equal to or higher than the input voltage Vin. Thus, the first MOS transistor Q1 is turned off. After that, when the fourth switch SD1 is turned on at a time point t3, the first MOS transistor Q1 is turned on as with the operation at the time point t1. Subsequently, the first MOS transistor Q1 is turned on or off in accordance with the on or off operation of the fourth switch SD1 as with the above.

Figure 5:
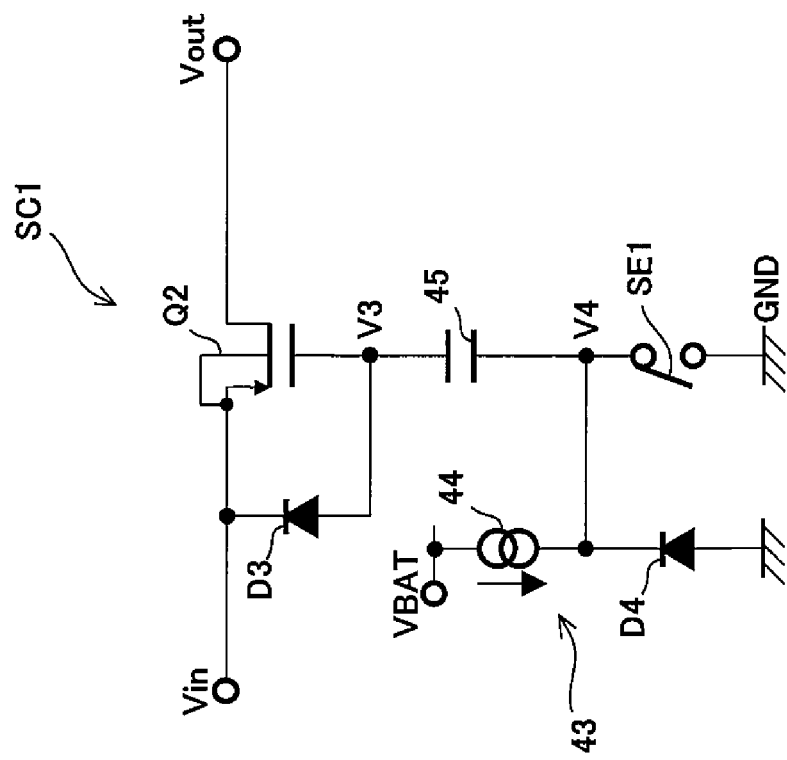
FIG. 5 is a circuit diagram showing a schematic configuration of a third switch of the multiplexer shown in FIG. 1.

FIG. 5 is a circuit diagram showing a schematic configuration of the third switch of the multiplexer shown in FIG. 1. As shown in FIG. 5, the third switch SC1 includes: a second MOS transistor Q2 in which a first main terminal (source) thereof is connected to the second switches SB0 to SBn-1 (the input voltage Vin is input to the first main terminal), and a second main terminal (drain) thereof is connected to the output terminal TO1 (the output voltage Vout is applied to the second main terminal), the second MOS transistor Q2 being complementary to the first MOS transistor Q1; a third constant voltage element D3 connected between a control terminal (gate) of the second MOS transistor Q2 and the first main terminal thereof and configured to define a maximum value of the potential difference between the control terminal and the first main terminal (maximum value of the voltage between the gate and the source); a second capacitor 45 including one end connected to the control terminal; a fifth switch SE1 configured to establish or cut the connection between the second capacitor 45 and the ground GND that has the reference potential; and a second constant voltage circuit 43 configured to apply a predetermined voltage to between the second capacitor 45 and the fifth switch SE1. In the present embodiment, the second MOS transistor Q2 is constituted by an N-channel MOS transistor.

As with the first constant voltage circuit 41, the second constant voltage circuit 43 includes: a fourth constant voltage element D4 connected to the other end of the second capacitor 45; and a second current source 44 configured to supply a current to the fourth constant voltage element D4 to apply a predetermined constant voltage VD to between the second capacitor 45 and the fourth constant voltage element D4.

For example, a zener diode is used as each of the third constant voltage element D3 and the fourth constant voltage element D4. Each of the third constant voltage element D3 and the fourth constant voltage element D4 has the forward direction voltage VD, and the forward direction voltage VD is set as an adequate voltage by which the second MOS transistor Q2 is turned on. In the present embodiment, the second MOS transistor Q2 is constituted by an N-channel MOS transistor. Therefore, a forward direction of the third constant voltage element D3 is set to a direction from the source of the second MOS transistor Q2 to the gate thereof.

According to the above configuration, as with the first switch SA1, the third switch SC1 can operate even by the voltage higher than the power supply voltage VBAT with a simple configuration.

Figure 6:
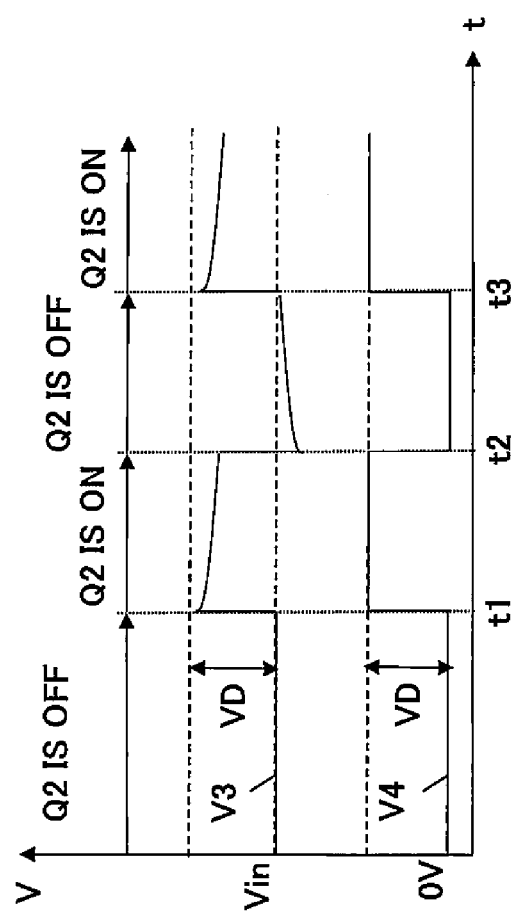
FIG. 6 is a graph showing a voltage waveform between both end portions of a second capacitor in the third switch shown in FIG. 5.

Operations of the third switch SC1 will be more specifically explained. FIG. 6 is a graph showing a voltage waveform between both end portions of the second capacitor in the third switch shown in FIG. 5. FIG. 6 shows a change with time in the voltage (third end portion voltage) V3 between the second capacitor 45 and the control terminal of the second MOS transistor Q2 and a change with time in the voltage (fourth end portion voltage) V4 between the second capacitor 45 and the fifth switch SE1.

First, when the fifth switch SE1 is in an on state, the voltage (third end portion voltage) V3 between the second capacitor 45 and the control terminal of the second MOS transistor Q2 becomes the reference potential (0V). Here, if an adequate time has elapsed, and the second capacitor 45 is in a steady state, a current does not flow through the second capacitor 45, so that the current does not flow through the third constant voltage element D3, either. Therefore, the third end portion voltage V3 becomes equal to the input voltage Vin. On this account, the potential difference is not generated between the source and gate of the second MOS transistor Q2, and the second MOS transistor Q2 is turned off (time points 0 to t1).

Next, when the fifth switch SE1 is turned off at the time point t1, the constant voltage VD is generated at the fourth constant voltage element D4 by the supply of a current from the second current source 44 to the fourth constant voltage element D4. With this, the voltage (fourth end portion voltage) V4 between the second capacitor 45 and the fifth switch SE1 changes from the reference potential (0V) to the constant voltage VD of the fourth constant voltage element D4. On the other hand, since the potential difference between both ends of the second capacitor 45 instantly changes little, the third end portion voltage V3 also increases by the voltage increase (voltage VD) of the fourth end portion voltage V4, that is, V1 equals Vin plus VD. With this, the potential difference VD is generated between the source and gate of the second MOS transistor Q2, and the second MOS transistor Q2 is turned on.

After that, when the fifth switch SE1 is turned on at the time point t2, the fourth end portion voltage V4 changes from the constant voltage VD generated by the fourth constant voltage element D4 to the reference potential, so that the third end portion voltage V3 also decreases by the voltage drop (voltage VD) of the fourth constant voltage element D4. Here, the third end portion voltage V3 slightly decreases in an off period of the fifth switch SE1. Therefore, the third end portion voltage V3 immediately before the fifth switch SE1 is turned on is not higher than Vin+VD. On this account, by turning on the fifth switch SE1, the third end portion voltage V3 decreases by the voltage VD to become a voltage equal to or lower than the input voltage Vin. Thus, the second MOS transistor Q2 is turned off. After that, when the fifth switch SE1 is turned off at the time point t3, the second MOS transistor Q2 is turned on as with the operation at the time point t1. Subsequently, the second MOS transistor Q2 is turned on or off in accordance with the on or off operation of the fifth switch SE1 as with the above.

As above, according to the configuration of the present embodiment, the operations of the fourth switch SD1 of the first switch SA1 and the operations of the fifth switch SE1 of the third switch SC1 are set to be the same as each other. With this, the first switch SA1 and the third switch SC1 are alternatively turned on. Therefore, the fourth switch SD1 and the fifth switch SE1 can be operated by the same control signal, so that the circuit configuration can be further simplified.

Embodiment 2

Figure 7:
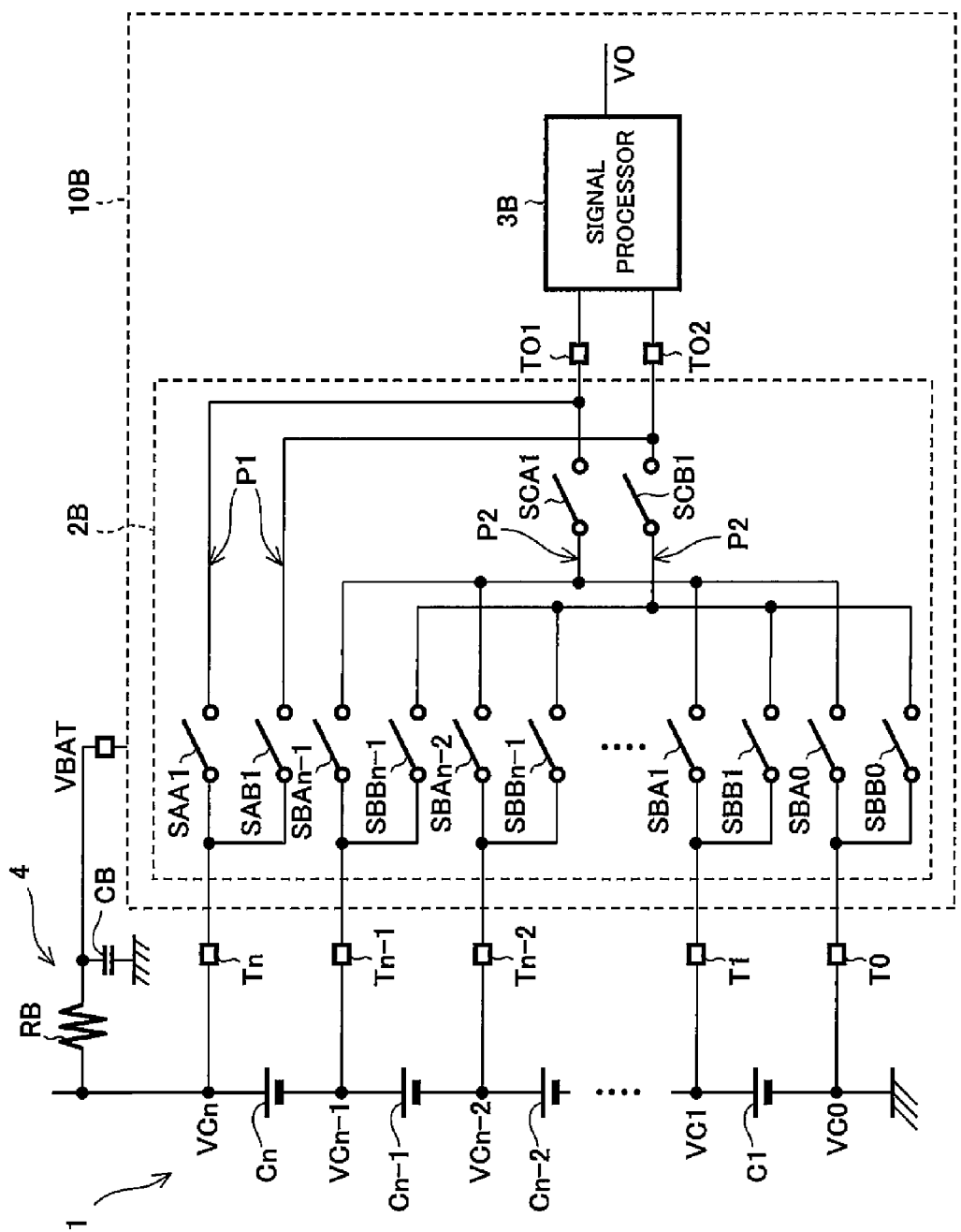
FIG. 7 is a circuit diagram showing an example of a schematic configuration of a battery system to which the voltage measuring unit according to Embodiment 2 of the present invention is applied.

Next, the voltage measuring unit to which the multiplexer according to Embodiment 2 of the present invention is applied will be explained. FIG. 7 is a circuit diagram showing an example of a schematic configuration of the voltage measuring unit to which the multiplexer according to Embodiment 2 of the present invention is applied. In the present embodiment, the same reference signs are used for the same components as in Embodiment 1, and a repetition of the same explanation is avoided. A voltage measuring unit 10B of the present embodiment is different from the voltage measuring unit 10 of Embodiment 1 in that as shown in FIG. 7, each input terminal Ti can be connected to a normal phase and a reverse phase.

Specifically, the output terminal of the multiplexer 2B is constituted by a pair of output terminals TO1 and TO2. Each of the first switch, the second switches, and the third switch includes: a normal phase switch configured to establish or cut the connection between any one of the plurality of input terminals Ti and the output terminal TO1 out of the pair of output terminals TO1 and TO2; and a reverse phase switch configured to establish or cut the connection between any one of the plurality of input terminals Ti and the output terminal TO2 out of the pair of output terminals TO1 and TO2. To be specific, the first switch includes a normal phase first switch SAA1 and a reverse phase first switch SAB1, the second switches respectively include normal phase second switches SBA0 to SBAn-1 and reverse phase second switches SBB0 to SBBn-1, and the third switch includes a normal phase third switch SCA1 and a reverse phase third switch SCB1.

Figure 8:
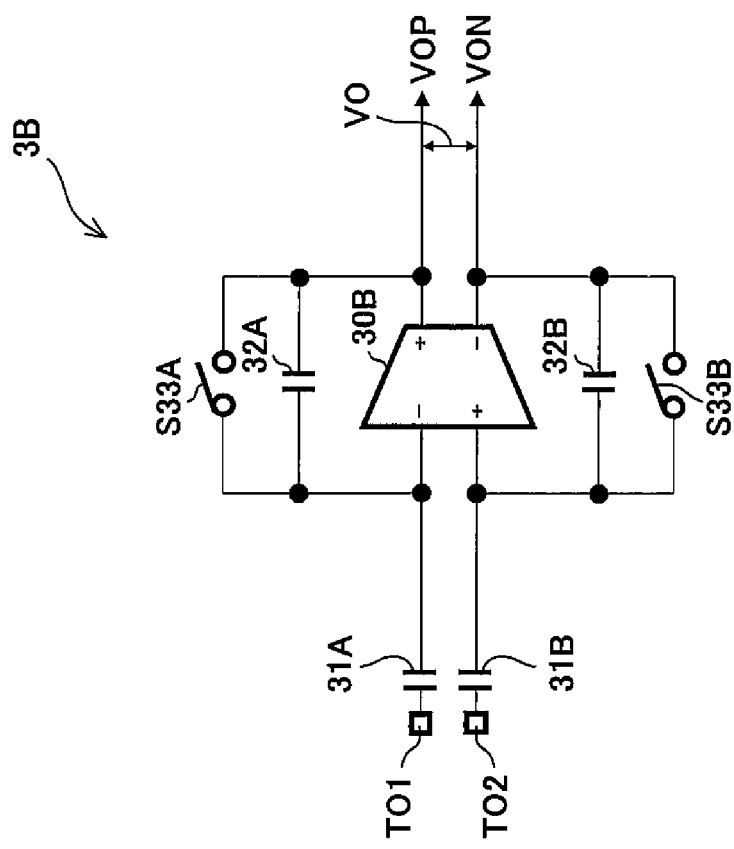
FIG. 8 is a circuit diagram showing a schematic configuration of the signal processor of the voltage measuring unit shown in FIG. 7.

FIG. 8 is a circuit diagram showing a schematic configuration of the signal processor of the voltage measuring unit shown in FIG. 7. As shown in FIG. 8, the signal processor 3B includes: a pair of capacitors 31A and 31B, the capacitor 31A including one end connected to the output terminal TO1 of the multiplexer 2B and charged in accordance with the voltage output from the output terminal TO1, the capacitor 31B including one end connected to the output terminal TO2 of the multiplexer 2B and charged in accordance with the voltage output from the output terminal TO2; a differential amplifier 30B including a pair of input terminals respectively connected to the other end of the capacitor 31A and the other end of the capacitor 31B; a pair of capacitors 32A and 32B, the capacitor 32A being connected between one input terminal and one output terminal of the differential amplifier 30B, the capacitor 32B being connected between the other input terminal and the other output terminal of the differential amplifier 30B; and a pair of switches S33A and S33B, the switch S33A being connected parallel to the capacitor 32A, the switch S33B being connected parallel to the capacitor 32B. To be specific, the signal processor 3B is configured as a so-called capacity type amplifying circuit.

Operations of the signal processor 3B configured as above will be explained using as an example a case where the voltage of the battery cell Cn is measured. First, the switches S33A and S33B are turned on (connected) in a state where the switches of the multiplexer 2B are turned off. With this, the electric charge of the capacitors 31A, 31B, 32A, and 32B is discharged, and the output voltage VO (a normal phase output voltage VOP and a reverse phase output voltage VON) of the differential amplifier 30B is set to zero. After that, the normal phase first switch SA1 and the reverse phase second switch SBBn-1 are turned on. With this, the voltage VCn at an upper side of the battery cell Cn is output to the normal phase output terminal TO1 through the first channel P1 including the input terminal Tn and the normal phase first switch SAA1, and the voltage VCn-1 at a lower side of the battery cell Cn is output to the reverse phase output terminal TO2 through the second channel P2 including the input terminal Tn-1 and the reverse phase second switch SBBn-1. The normal phase capacitor 31A is charged in accordance with the voltage VCn output from the normal phase output terminal TO1, and the reverse phase capacitor 31B is charged in accordance with the voltage VCn-1 output from the reverse phase output terminal TO2.

After that, the pair of switches S33A and S33B, the normal phase first switch SAA1, and the reverse phase second switch SBBn-1 are turned off, and the normal phase second switch SBAn-1 and the reverse phase first switch SAB1 are then turned on. With this, the voltage VCn-1 at a lower side of the battery cell Cn is output to the normal phase output terminal TO1 through the second channel P2 including the input terminal Tn-1 and the normal phase second switch SBAn-1, and the voltage VCn at an upper side of the battery cell Cn is output to the reverse phase output terminal TO2 through the first channel P1 including the input terminal Tn and the reverse phase first switch SAB1.

Thus, the electric charge corresponding to the voltage drop from the voltage VCn to the voltage VCn-1 is discharged from the normal phase capacitor 31A such that the electric charge corresponding to the voltage VCn-1 is accumulated in the normal phase capacitor 31A. At this time, since the switch S33A is in an off state, the electric charge corresponding to the voltage drop is transferred from the normal phase capacitor 31A to the normal phase capacitor 32A. On the other hand, the electric charge corresponding to the voltage increase from the voltage VCn-1 to the voltage VCn is charged in the reverse phase capacitor 31B such that the electric charge corresponding to the voltage VCn is accumulated in the reverse phase capacitor 31B. At this time, since the switch S33B is in an off state, the electric charge corresponding to the voltage increase is transferred from the reverse phase capacitor 32A to the reverse phase capacitor 31B.

Thus, the difference voltage between the voltage VCn and the voltage VCn-1, that is, the normal phase voltage of the battery cell Cn is applied to the normal phase capacitor 32A, and this is output as the normal phase output voltage VOP of the differential amplifier 30B. In addition, the difference voltage between the voltage VCn-1 and the voltage VCn, that is, the reverse phase voltage of the battery cell Cn is applied to the reverse phase capacitor 32B, and this is output as the reverse phase output voltage VON of the differential amplifier 30B. As above, the electric charge accumulated in the capacitor 32A and the electric charge accumulated in the capacitor 32B are respectively positive and negative and are the same in amount as each other. Therefore, it is possible to double a gain of the output voltage VO, the gain being obtained by outputting as the output voltage VO a difference (VOP−VON) between the normal phase output voltage VOP and the reverse phase output voltage VON. The same is true for a case where the other battery cells Cj are measured.

Embodiment 3

Figure 9:
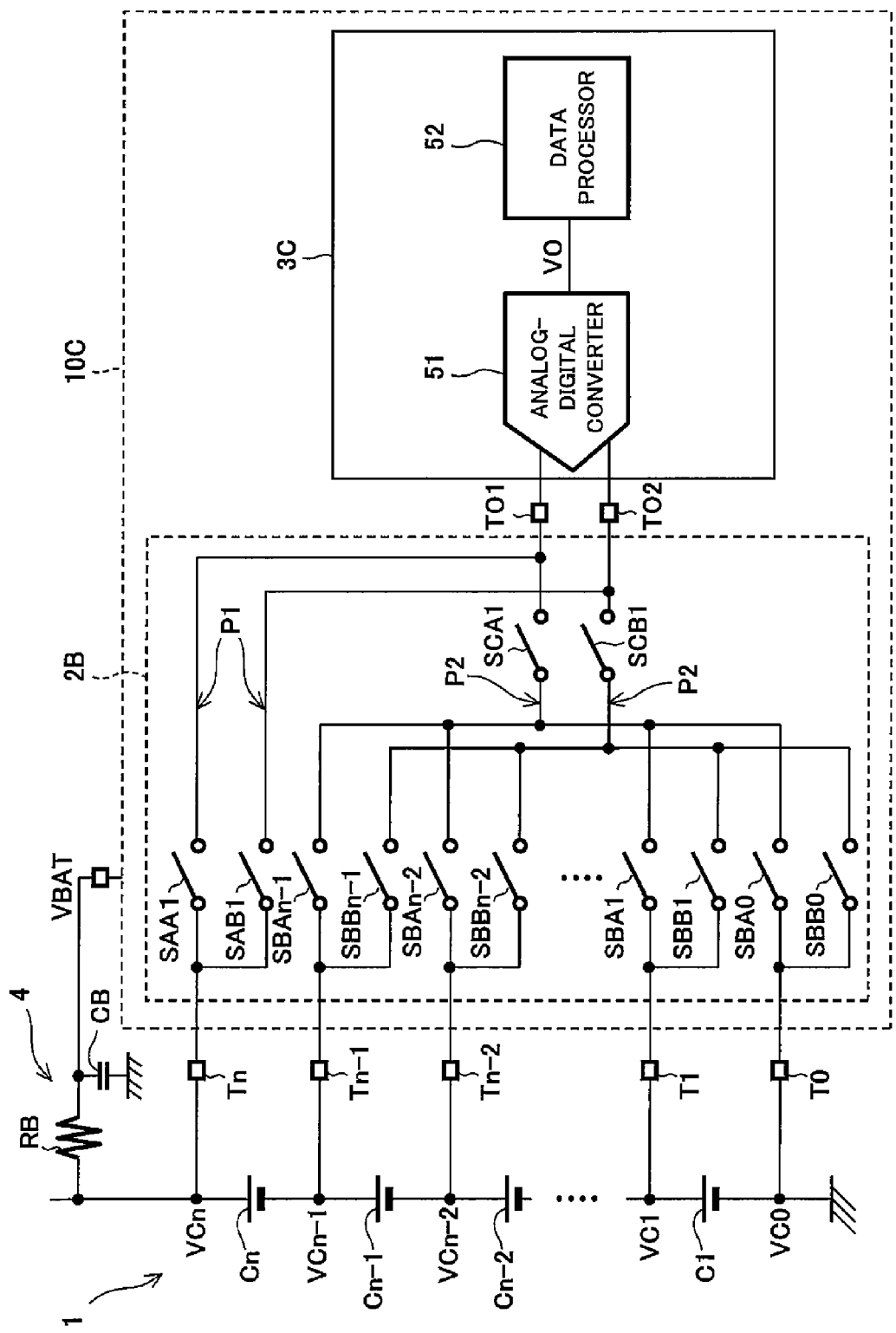
FIG. 9 is a circuit diagram showing an example of a schematic configuration of the voltage measuring unit to which the multiplexer according to Embodiment 3 of the present invention is applied.

Next, the voltage measuring unit to which the multiplexer according to Embodiment 3 of the present invention is applied will be explained. FIG. 9 is a circuit diagram showing an example of a schematic configuration of the voltage measuring unit to which the multiplexer according to Embodiment 3 of the present invention is applied. In the present embodiment, the same reference signs are used for the same components as in Embodiment 2, and a repetition of the same explanation is avoided. As shown in FIG. 9, a voltage measuring unit 10C of the present embodiment is different from the voltage measuring unit 10B of Embodiment 2 in that the signal processor 3C includes: an analog-digital converter 51 configured to convert, from analog to digital, voltage signals output from the pair of output terminals TO1 and TO2 of the multiplexer 2B; and a data processor 52 configured to process the digital voltage signal. The multiplexer 2B is also applied to the above case where the voltage management is performed by digitalizing the voltage signal. With this, even in a case where the input voltage higher than the power supply voltage VBAT is applied, the increase in the circuit area can be suppressed while realizing highly accurate voltage measurement.

Embodiment 4

Figure 10:
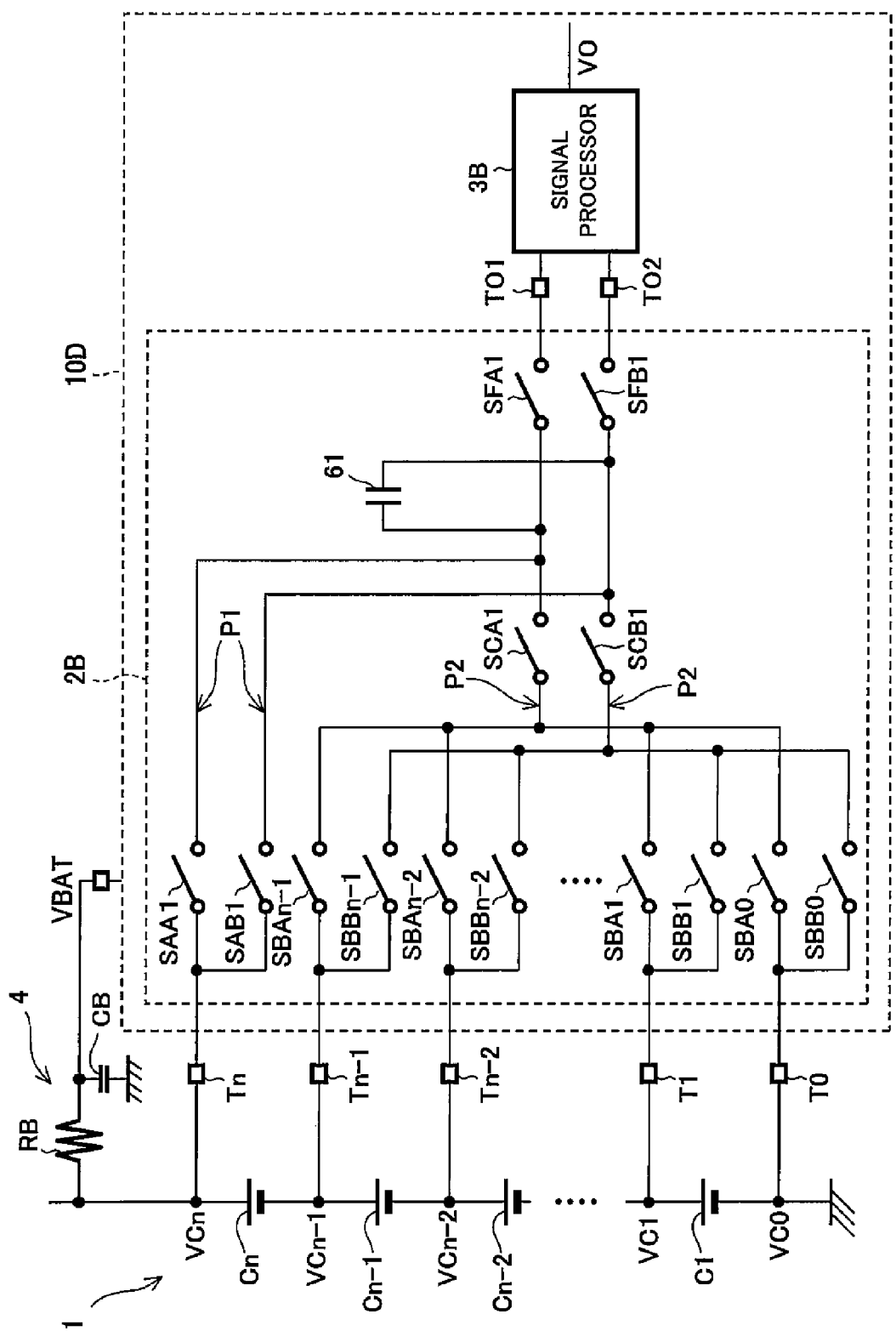
FIG. 10 is a circuit diagram showing an example of a schematic configuration of the voltage measuring unit to which the multiplexer according to Embodiment 4 of the present invention is applied.
Figure 11:
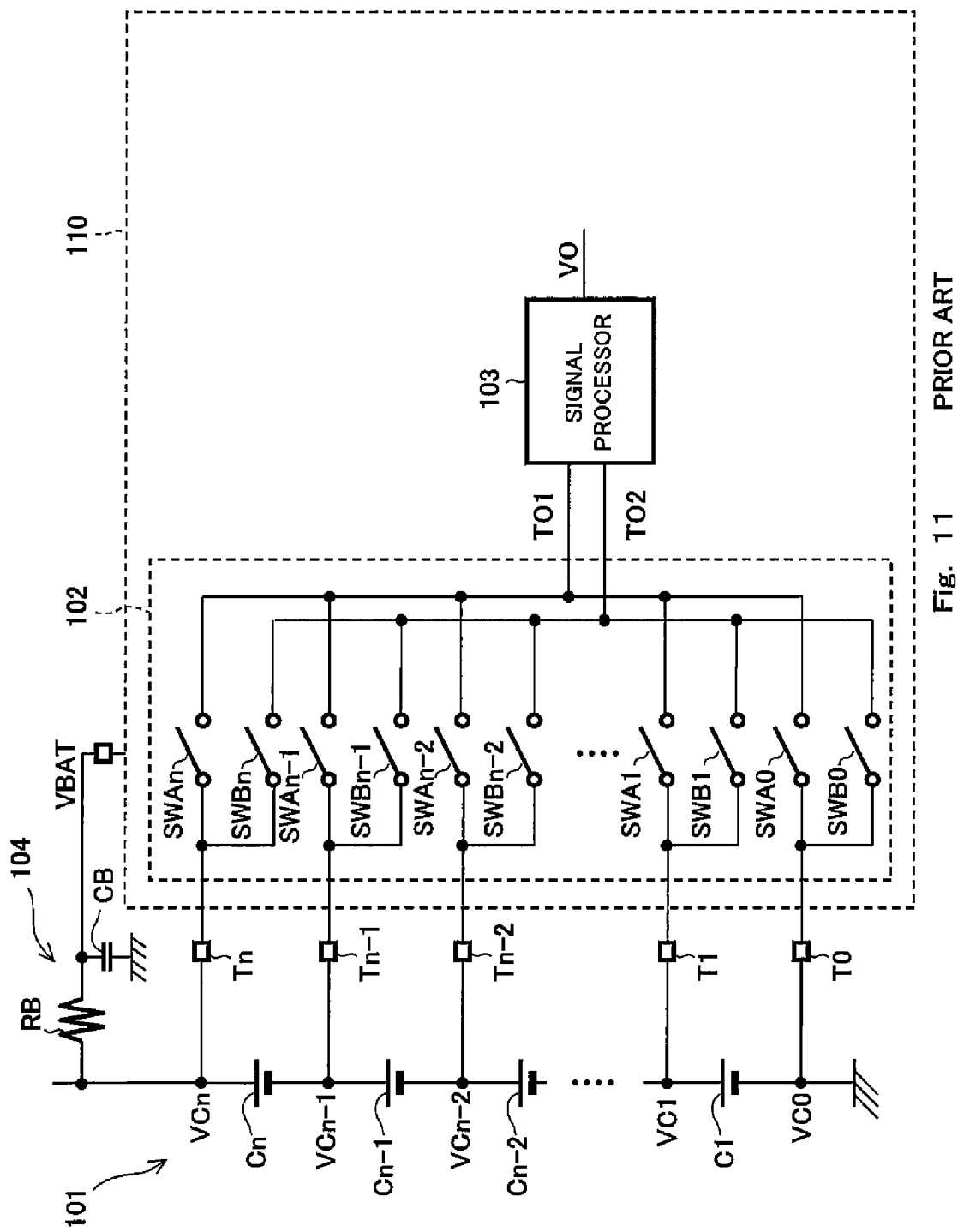
FIG. 11 is a circuit diagram showing a schematic configuration of a conventional voltage measuring unit.

Next, the voltage measuring unit to which the multiplexer according to Embodiment 4 of the present invention is applied will be explained. FIG. 10 is a circuit diagram showing an example of a schematic configuration of the voltage measuring unit to which the multiplexer according to Embodiment 4 of the present invention is applied. In the present embodiment, the same reference signs are used for the same components as in Embodiment 2, and a repetition of the same explanation is avoided. As shown in FIG. 10, a voltage measuring unit 10D of the present embodiment is different from the voltage measuring unit 10B of Embodiment 2 in that the voltage measuring unit 10D includes: a pair of sixth switches SFA1 and SFB1, the sixth switch SFA1 being connected between the first switch SAA1 and the output terminal TO1 and between the third switch SCA1 and the output terminal TO1, the sixth switch SFB1 being connected between the first switch SAB1 and the output terminal TO2 and between the third switch SCB1 and the output terminal TO2; and a flying capacitor 61 connected between the first switch SAA1 and the sixth switch SFA1, between the third switch SCA1 and the sixth switch SFA1, between the first switch SAB1 and the sixth switch SFB1, and between the third switch SCB1 and the sixth switch SFB1.

According to this, by establishing the connections by the first switches SAA1 and SAB1 or the third switches SCA1 and SCB1 in a state where the connections by the sixth switches SFA1 and SFB1 are being cut (off state), the flying capacitor 61 is charged by the voltage to be measured. After that, by cutting the connections by the first switches SAA1 and SAB1 or the third switches SCA1 and SCB1 and establishing the connections by the sixth switches SFA1 and SFB1, the charge voltage of the flying capacitor 61 is applied to the output terminals TO1 and TO2 (the charge voltage of the flying capacitor 61 is input to the signal processor 3B connected to and located behind the output terminals TO1 and TO2). With this, the highly accurate voltage measurement can be performed while securing the insulation property between the battery cell Cj and the signal processor 3B. In addition, the voltage to be charged in the flying capacitor 61 is the difference voltage between the voltage connected to the normal phase and the voltage connected to the reverse phase (the voltage applied to each of the input terminals T0 to Tn is not directly input). Therefore, regardless of whether or not (there is a possibility that) the voltage to be measured is higher than the power supply voltage VBAT input from the high-voltage input terminal Tn, each of the flying capacitor 61 and the sixth switches SFA1 and SFB1 can be configured as a typical component driven by a voltage equal to or lower than the power supply voltage VBAT (each of the flying capacitor 61 and the sixth switches SFA1 and SFB1 does not have to be configured as a component capable of being driven by a high voltage).

The foregoing has explained the embodiments of the present invention. However, the present invention is not limited to the above embodiments, and improvements, changes, and modifications may be made within the scope of the present invention. For example, respective components in the above embodiments may be combined arbitrarily. In the above embodiments, the high-voltage input terminal is only the input terminal Tn to which the highest voltage VCn among the voltages respectively applied to the plurality of input terminals T0 to Tn is applied. However, the present invention is not limited to this. Switches connected to a plurality of input terminals to each of which a voltage higher than the power supply voltage VBAT may be applied may be configured as the first switch.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the spirit of the present invention.

INDUSTRIAL APPLICABILITY

The multiplexer and voltage measuring unit of the present invention are useful to suppress the increase in the circuit area while realizing highly accurate voltage measurement even in a case where the input voltage higher than the power supply voltage is applied.

REFERENCE SIGNS LIST 1 battery cell array
2, 2B multiplexer
3, 3B, 3C signal processor
4 filter
10, 10B, 10C, 10D voltage measuring unit
30, 30B differential amplifier
31, 31A, 31B, 32, 32A, 32B capacitor
40 first capacitor
41 first constant voltage circuit
42, 44 current source
43 second constant voltage circuit
45 second capacitor
51 digital converter
52 data processor
61 flying capacitor
Cj (j equals 1 to n) battery cell
D1 first constant voltage element
D2 second constant voltage element
D3 third constant voltage element
D4 fourth constant voltage element
P1 first channel
P2 second channel
Q1 first MOS transistor
Q2 second MOS transistor
S33, S33A, S33B switch
SA1, SAA1, SAB1 first switch
SB0 to SBn-1, SBA0 to SBn-1, SBB0 to SBBn-1 second switch
SC1, SCA1, SCB1 third switch
SD1 fourth switch
SE1 fifth switch
SFA1, SFB1 sixth switch
Ti (i equals 0 to n) input terminal
TO1, TO2 output terminal

What is claimed is:

1. A multiplexer for voltage measurement configured to receive voltages at connection terminals of a plurality of battery cells connected in series and constituting a battery cell array and output one of the voltages, to measure voltages of the battery cells, the multiplexer comprising:

a plurality of input terminals to which the voltages at the connection terminals of the plurality of battery cells are respectively input;

an output terminal through which any one of the voltages input from the plurality of input terminals is output;

a first switch disposed on a first channel extending between at least one high-voltage input terminal that is one of the plurality of input terminals and the output terminal and configured to establish or cut a connection between the high-voltage input terminal and the output terminal, the high-voltage input terminal being connected to a predetermined number of battery cells, the predetermined number being counted from a side where a highest voltage among the voltages respectively applied to the plurality of input terminals is applied;

a plurality of second switches respectively disposed on second channels each extending between each of the input terminals other than the high-voltage input terminal and the output terminal so as to respectively correspond to the input terminals, and configured to selectively establish or cut a connection between any one of the input terminals other than the high-voltage input terminal and the output terminal; and a third switch disposed between a group of the plurality of second switches and an output terminal side end of the first switch, wherein each of the first switch and the third switch is configured to operate even by a voltage higher than a power supply voltage that is based on a voltage of the battery cell array, the voltage of the battery cell array being used to drive each of the first, second, and third switches.

2. The multiplexer according to claim 1, wherein the high-voltage input terminal is the input terminal to which a highest voltage among the voltages respectively applied to the plurality of input terminals is applied.

3. The multiplexer according to claim 1, wherein:
the output terminal is constituted by a pair of output terminals; and
each of the first switch, the second switches, and the third switch includes
a normal phase switch configured to establish or cut a connection between any one of the plurality of input terminals and one of the pair of output terminals, and
a reverse phase switch configured to establish or cut a connection between any one of the plurality of input terminals and the other of the pair of output terminals.

4. The multiplexer according to claim 1, wherein the first switch includes:
a first MOS transistor in which a first main terminal thereof is connected to the input terminal, and a second main terminal thereof is connected to the output terminal;
a first constant voltage element connected between a control terminal of the first MOS transistor and the first main terminal thereof and configured to define a maximum value of a potential difference between the control terminal and the first main terminal;
a first capacitor including one end connected to the control terminal;
a fourth switch configured to establish or cut a connection between the first capacitor and a reference potential; and
a first constant voltage circuit configured to apply a predetermined voltage to between the first capacitor and the fourth switch.

5. The multiplexer according to claim 4, wherein the first constant voltage circuit includes:
a second constant voltage element connected to the other end of the first capacitor; and
a current source configured to supply a current to the second constant voltage element to apply a predetermined constant voltage to between the first capacitor and the second constant voltage element.

6. The multiplexer according to claim 4, wherein the third switch includes:
a second MOS transistor in which a first main terminal thereof is connected to the second switches, and a second main terminal thereof is connected to the output terminal, the second MOS transistor being complementary to the first MOS transistor;
a third constant voltage element connected between a control terminal of the second MOS transistor and the first main terminal thereof and configured to define a maximum value of a potential difference between the control terminal and the first main terminal;
a second capacitor including one end connected to the control terminal;
a fifth switch configured to establish or cut a connection between the second capacitor and a reference potential; and
a second constant voltage circuit configured to apply a predetermined voltage to between the second capacitor and the fifth switch.

7. The multiplexer according to claim 3, comprising:
a pair of sixth switches, one of which is connected between the first switch and one of the pair of output terminals, and the other of which is connected between the third switch and the other of the pair of output terminals; and
a flying capacitor connected between the first switch and one of the pair of sixth switches and between the third switch and the other of the pair of sixth switches.

8. A voltage measuring unit comprising:
the multiplexer according to claim 1; and
a signal processor configured to perform calculation processing of voltages of the battery cells based on the voltages at the input terminals output from the pair of output terminals.

* * * * *